(12) United States Patent
Lee

(10) Patent No.: US 9,196,382 B2
(45) Date of Patent: Nov. 24, 2015

(54) SEMICONDUCTOR TEST DEVICE

(71) Applicant: SK HYNIX INC., Icheon (KR)

(72) Inventor: Wan Seob Lee, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/253,598

(22) Filed: Apr. 15, 2014

(65) Prior Publication Data

US 2015/0213907 A1     Jul. 30, 2015

(30) Foreign Application Priority Data

Jan. 29, 2014 (KR) .................. 10-2014-0011183

(51) Int. Cl.
*G11C 29/00*     (2006.01)
*G11C 29/12*     (2006.01)
*G11C 29/36*     (2006.01)

(52) U.S. Cl.
CPC .......... *G11C 29/12015* (2013.01); *G11C 29/36* (2013.01)

(58) Field of Classification Search
None
See application file for complete search history.

(56) References Cited

U.S. PATENT DOCUMENTS

| 6,785,173 | B2 | 8/2004 | Sohn et al. | |
|---|---|---|---|---|
| 7,516,384 | B2 | 4/2009 | Jeong et al. | |
| 7,587,645 | B2 | 9/2009 | Chang et al. | |
| 7,742,359 | B2 | 6/2010 | Nam | |
| 2003/0031082 | A1* | 2/2003 | Sawada | 365/233 |
| 2003/0112696 | A1* | 6/2003 | Lee | 365/233 |

* cited by examiner

*Primary Examiner* — April Y Blair
*Assistant Examiner* — Thien D Nguyen

(57) ABSTRACT

A semiconductor test device performs a test using a high-speed internal clock. The semiconductor test device includes a clock generator suitable for generating an internal clock in response to a test mode signal during a test mode, a data generator suitable for generating internal data in response to the internal clock, and a data latch circuit suitable for latching the internal data in response to the internal clock, and outputting the latched data to an internal logic circuit.

9 Claims, 8 Drawing Sheets

SEMICONDUCTOR TEST DEVICE

CROSS-REFERENCE TO RELATED APPLICATION

The present application claims priority to Korean Patent Application No. 10-2014-0011183, filed on Jan. 29, 2014, the disclosure of which is incorporated herein in its entirety by reference.

BACKGROUND

Embodiments of the present disclosure relate to a semiconductor test device, and more particularly, to a technology for performing a test operation using a high-speed clock signal and data that are internally generated.

As the degree of integration of semiconductor memory devices increases, semiconductor memory devices have been continuously improved upon to increase an operation speed. In order to increase operation speed, synchronous memory devices, which operate by being synchronized with an external clock, have been proposed and developed.

A representative synchronous memory device is a single data rate (SDR) synchronous memory device, which is synchronized with a rising edge of an external clock such that one bit data can be input or output through one data pin during one period of the external clock.

However, it is difficult for a SDR synchronous memory device to perform high-speed operations in a system. In order to solve this problem of the SDR synchronous memory device, a double data rate (DDR) synchronous memory device capable of processing two bits of data during one clock period has been proposed.

Two contiguous bits of data are input and output through respective data input/output (I/O) pins of a DDR synchronous memory device, and the two contiguous bits of data are synchronized with a rising edge and a falling edge of an external clock. Therefore, although a frequency of the external clock does not increase, the DDR synchronous memory device may have a bandwidth that is at least two times larger than that of a SDR synchronous memory device. As a result, the DDR synchronous memory device can operate at a higher speed than the SDR synchronous memory device.

The DDR synchronous memory device is suitable for a multi-bit prefetching scheme capable of simultaneously processing multiple bits (multi-bit) of data. The multi-bit prefetching scheme synchronizes sequential input data with a data strobe signal such that the input data can be arranged in parallel to one another. Thereafter, according to the multi-bit prefetching scheme, the input data arranged in parallel are simultaneously stored upon receiving a write command synchronized with an external clock.

Generally, semiconductor memory devices such as dynamic random access memory (DRAM) devices are designed to support various test operations. In order to decrease production costs and increase productivity of semiconductor memory devices, various tests have been applied to the semiconductor memory devices at a wafer level and a package level.

In testing semiconductor memory devices, it is important to test the reliability of the semiconductor memory devices. In addition, it is important to be able to test many memory cells, for example, in the order of tens of millions of memory cells, at a high speed. Specifically, reduction of a development period of semiconductor memory devices and reduction of a test time consumed in testing manufactured semiconductor memory devices may reduce production costs. As a result, the test time is an important factor for production efficiency and competition between manufacturers.

According to the conventional art, a potential (or latent) defect in an element per bank can be detected only through a test executed at a package level, and the detected defective element can be repaired only at the package level. However, if the detected defective element is repaired at the package level, production time increases and more production costs are consumed compared to other technologies that repair a defective element at a wafer level.

Meanwhile, if a channel for bank selection is allocated during testing at a wafer level, the number of chips (dies) to be tested may be determined depending on the number of channels that are limited. That is, if a probe test device is assigned a small number of channels although a high-speed test should be applied to the probe test device, the number of chips (dies) capable of being simultaneously tested is reduced. As a result, the overall test time unavoidably increases when all chips (dies) on a wafer are tested.

In addition, as an operation speed of semiconductor memory devices rapidly increases, the speeds of a clock and data that a test device is able to provide cannot reach a threshold speed at which semiconductor memory devices operate. Accordingly, a semiconductor test device capable of transmitting input data at a high speed in a test operation is in demand.

As an operation speed of a system including semiconductor devices becomes faster and as technology of semiconductor integrated circuits (ICs) develops, there is a need for semiconductor memory devices that can output/store data at higher speeds. Indeed, semiconductor memory devices capable of storing much more data and reading/writing data at higher speeds are increasingly in demand.

As a result, the design and manufacturing processes of the semiconductor memory devices have become more complicated, and processes for testing the manufactured semiconductor memory devices have also become complicated and difficult to implement. For example, the number of operations to be tested unavoidably increases, and a testing process for each operation is complicated. In other words, as a testing process of semiconductor memory devices having a higher storage capacity and a higher degree of integration becomes more complicated, a more complicated algorithm is used and a longer test time for performing the complicated algorithm are needed.

Accordingly, a conventional testing method for allowing automatic test equipment (ATE) to externally access and test semiconductor memory devices requires a very long test time, resulting in reduction of the test efficiency and productivity of the semiconductor memory devices.

SUMMARY

Various embodiments of the present disclosure are directed to a semiconductor test device that substantially obviates one or more problems due to limitations and disadvantages of the related art.

Embodiments of the present disclosure relate to a technology for excluding external data and an external clock and internally generating data and a high-speed clock signal to test a double data rate (DDR) device.

In accordance with an embodiment of the present invention, a semiconductor test device includes: a clock generator suitable for generating an internal clock in response to a test mode signal during a test mode; a data generator suitable for generating internal data in response to the internal clock; and a data latch circuit suitable for latching the internal data in response to the internal clock, and outputting the latched data to an internal logic circuit.

In accordance with another embodiment of the present invention, a semiconductor test device includes: a pre-driver suitable for outputting a first output signal by driving first output data in response to a rising clock and a falling clock; a data generator suitable for generating second output data in response to the rising clock and the falling clock; an internal pre-driver suitable for driving the second output data in response to the rising clock and the falling clock and outputting a second output signal; a data comparator suitable for outputting a comparison signal by comparing the first output signal to the second output signal; a data accumulator suitable for accumulating the comparison signal in response to the rising clock and the falling clock; and an output driver suitable for driving an output signal of the data accumulator during a test mode.

It is to be understood that both the foregoing general description and the following detailed description of the present invention are not limiting, but are intended to provide further explanation of the invention as claimed.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF EMBODIMENTS

Reference will now be made in detail to certain embodiments of the present disclosure and examples of which are illustrated in the accompanying drawings. Wherever possible, the same reference numbers will be used throughout the drawings to refer to the same or like parts.

Figure 1:
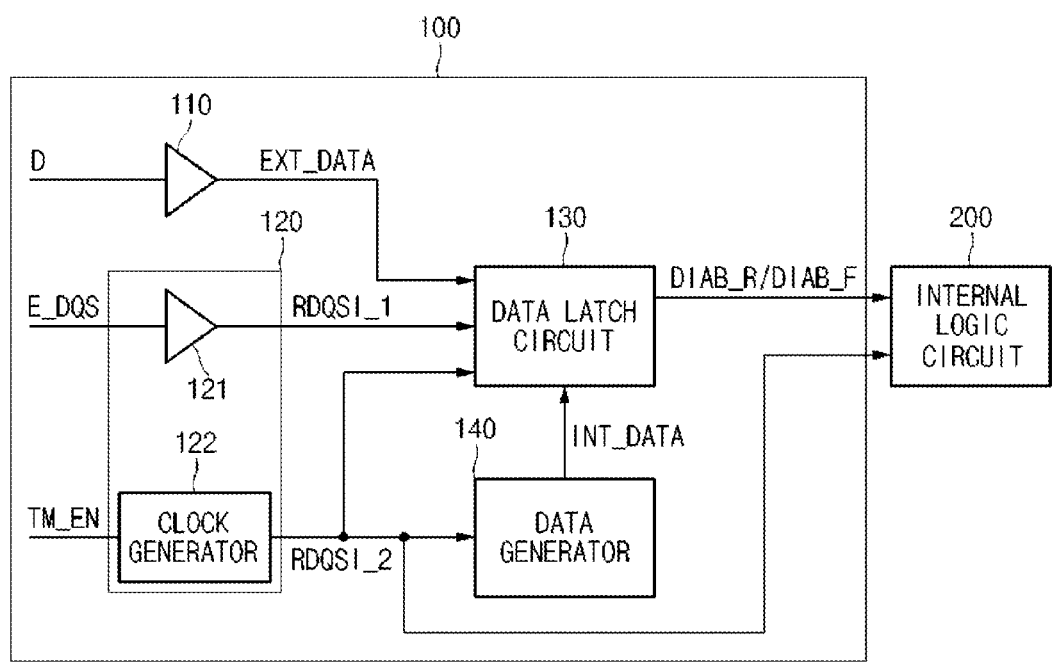
FIG. 1 is a block diagram illustrating a semiconductor test device according to an embodiment.

FIG. 1 is a block diagram illustrating a semiconductor test device according to an embodiment. The semiconductor test device is implemented in a data input path.

Referring to FIG. 1, the semiconductor test device includes an input test circuit 100 and an internal logic circuit 200. The input test circuit 100 includes an input buffer 110, a clock buffer 120, a data latch circuit 130, and a data generator 140.

The input buffer 110 buffers external input data D, and outputs the buffered external input data EXT_DATA to the data latch circuit 130. The clock buffer 120 buffers an external clock E_DQS) to generate a clock signal RDQSI_1, or generates an internal clock signal RDQSI_2 in response to a test mode signal TM_EN.

The clock buffer 120 includes an external clock buffer 121 and a clock generator 122. The external clock buffer 121 buffers the external clock E_DQS to generate the clock signal RDQSI_1, and outputs the clock signal RDQSI_1 to the data latch circuit 130. The clock generator 122 generates the internal clock signal RDQSI_2 in response to the test mode signal TM_EN during a test mode, and outputs the internal clock signal RDQSI_2 to the data generator 140 and the internal logic circuit 200.

The data latch circuit 130 latches the buffered external input data EXT_DATA in response to the clock signal RDQSI_1 generated by the external clock buffer 121, and outputs the latched external input data EXT_DATA as input data DIAB_R and DIAB_F to the internal logic circuit 200. In addition, the data latch circuit 130 latches internal data INT_DATA from the data generator 140 in response to the internal clock signal RDQSI_2 generated by the clock generator 122, and outputs the latched internal data INT_DATA as the input data (DIAB_R and DIAB_F to the internal logic circuit 200. In an embodiment, the input data DIAB_R and DIAB_F includes double data rate (DDR) data.

The data generator 140 generates the internal data INT_DATA in response to the internal clock signal RDQSI_2, and outputs the internal data INT_DATA to the data latch circuit 130.

During the test mode, the semiconductor test device according to an embodiment blocks the external clock E_DQS and the buffered external input data EXT_DATA, and latches the internal data INT_DATA in response to the internal clock signal RDQSI_2 and generates the input data DIAB_R and DIAB_F based on the internal data INT_DATA. That is, the semiconductor test device establishes a clock period of the internal clock signal RDQSI_2 in the clock generator 122 so as to test the internal data INT_DATA at a desired speed during the test mode.

Therefore, a semiconductor test device according to an embodiment can reduce a turn around time TAT by efficiently testing input data at a high speed at a wafer level prior to packaging.

Figure 2:
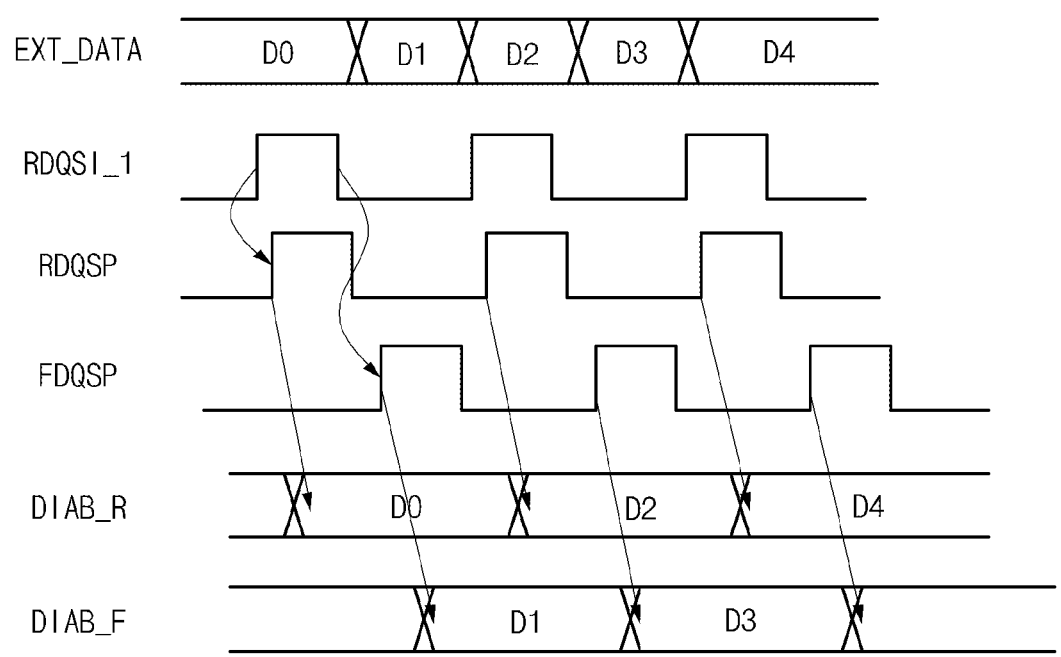
FIG. 2 is a timing diagram illustrating operations of the semiconductor test device of FIG. 1 in a normal mode according to an embodiment.

FIG. 2 is a timing diagram illustrating operations of the semiconductor test device of FIG. 1 in a normal mode according to an embodiment. The operations of the semiconductor test device in the normal mode will be described with reference to FIG. 1.

During the normal mode, the input buffer 110 buffers the external input data D, and outputs the buffered external input data EXT_DATA to the data latch circuit 130. The external clock buffer 121 generates the clock signal RDQSI_1 by buffering the external clock E_DQS, and outputs the clock signal RDQSI_1 to the data latch circuit 130. In the normal mode, the external clock buffer 121 operates, and the clock generator 122 does not operate.

In the normal mode, the data latch circuit 130 generates a rising clock RDQSP and a falling clock FDQSP in response to the clock signal RDQSI_1 generated by the external clock buffer 121. The rising clock RDQSP is a clock enabled by latching a rising edge of the clock signal RDQSI_1 for a predetermined time. The falling clock FDQSP is a clock enabled by latching a falling edge of the clock signal RDQSI_1 for a predetermined time.

The data latch circuit 130 latches the buffered external input data EXT_DATA in response to the rising clock RDQSP, and outputs the input data DIAB_R to the internal logic circuit 200. The data latch circuit 130 latches the buffered external input data EXT_DATA in response to the falling clock FDQSP, and outputs the input data DIAB_F to the internal logic circuit 200.

In this embodiment, data D0, D2, and D4 are synchronized with the rising clock RDQSP and output to the internal logic circuit 200. Data D1 and D3 are synchronized with the falling clock FDQSP and output to the internal logic circuit 200.

Figure 3:
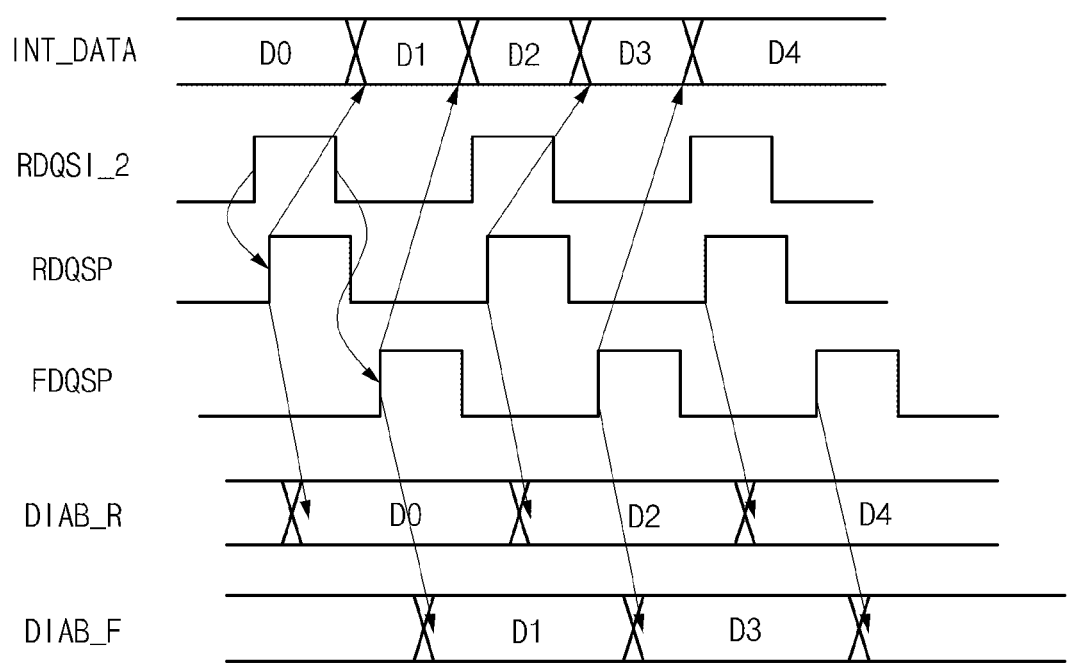
FIG. 3 is a timing diagram illustrating operations of the semiconductor test device of FIG. 1 in a test mode according to an embodiment.

FIG. 3 is a timing diagram illustrating operations of the semiconductor test device of FIG. 1 in a test mode according to an embodiment. The operations of the semiconductor test device in the test mode will be described with reference to FIG. 1.

During the test mode, the clock generator 122 generates the internal clock signal RDQSI_2 having a predetermined period in response to the test mode signal TM_EN for performing a high-speed test operation, and outputs the internal clock signal RDQSI_2 to the data latch circuit 130, the data generator 140, and the internal logic circuit 200. In the test mode, the clock generator 122 operates, and the input buffer 110 does not operate.

In the test mode, the data generator 140 generates a rising clock RDQSP and a falling clock FDQSP in response to the internal clock signal RDQSI_2 generated by the clock generator 122. The rising clock RDQSP is a clock enabled by latching a rising edge of the internal clock signal RDQSI_2 for a predetermined time. The falling clock FDQSP is a clock enabled by latching a falling edge of the internal clock signal RDQSI_2 for a predetermined time.

The data generator 140 generates the internal data INT_DATA in response to the rising clock RDQSP, and outputs the internal data INT_DATA to the data latch circuit 130. In addition, the data generator 140 generates the internal data INT_DATA in response to the falling clock FDQSP, and outputs the internal data INT_DATA to the data latch circuit 130.

The data latch circuit 130 latches the internal data INT_DATA in response to the rising clock RDQSP, and outputs the latched internal data INT_DATA as the input data DIAB_R to the internal logic circuit 200. In addition, the data latch circuit 130 latches the internal data INT_DATA in response to the falling clock FDQSP, and outputs the latched internal data INT_DATA as the input data DIAB_F to the internal logic circuit 200.

In this embodiment, data D0, D2, and D4 are synchronized with the rising clock RDQSP, and then output to the internal logic circuit 200. Data D1 and D3 are synchronized with the falling clock FDQSP, and then output to the internal logic circuit 200.

Figure 4:
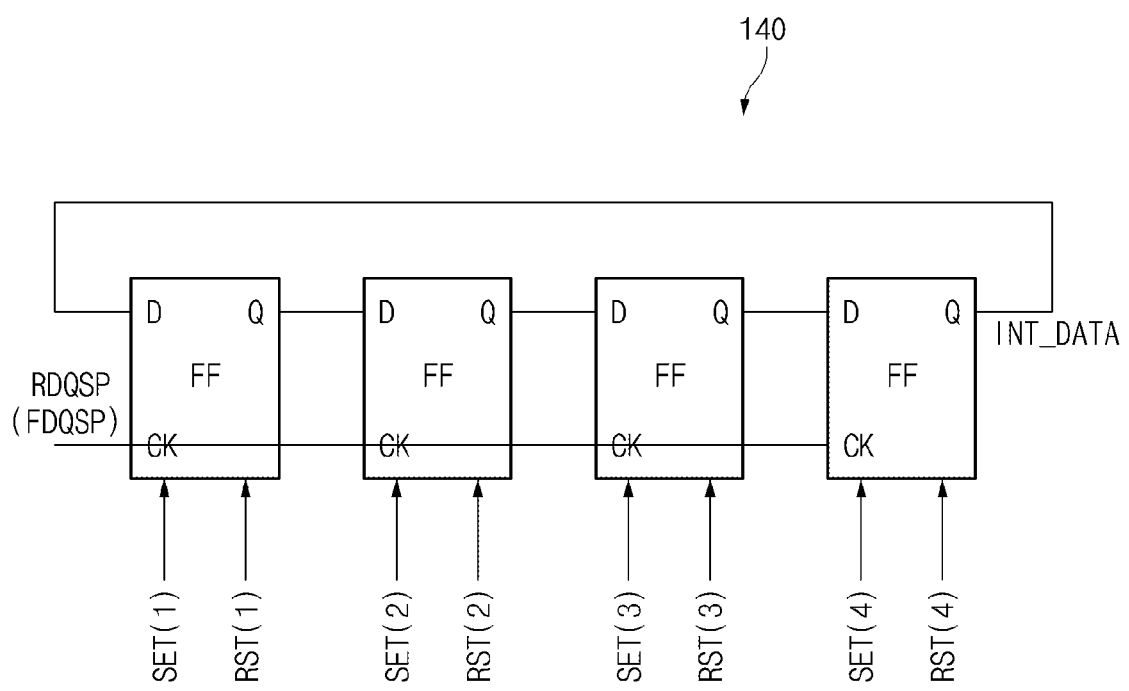
FIG. 4 is a detailed circuit diagram illustrating a data generator shown in FIG. 1 according to an embodiment.

FIG. 4 is a detailed circuit diagram illustrating the data generator 140 shown in FIG. 1 according to an embodiment. The data generator 140 includes a plurality of flip-flops FFs. The plurality of flip-flops FFs is coupled in series to each other, so that the flip-flops FFs operate in synchronization with a rising edge of the rising clock RDQSP and a rising edge of the falling clock FDQSP. Each of the flip-flops FFs may flip-flop input data D in response to the rising clock RDQSP and the falling clock FDQSP, and output the flip-flop result as output data Q.

Internal data INT_DATA generated from the last-stage flip-flop FF is fed back as input data D to a first-stage flip-flop FF. The flip-flops FFs may be initialized to a set status in response to a set signal SET, or may be initialized to a reset status in response to a reset signal RST.

The set signal SET and the reset signal RST may be input to individual flip-flops FFs, respectively. Accordingly, the flip-flops FFs are respectively controlled such that a desired data pattern can be output within a desired cycle. That is, a cycle of the desired data pattern may change depending on the number of flip-flops FFs that operate, and the cycle of the desired data pattern is repeated. Accordingly, a data pattern input to the internal logic circuit 200 can be flexibly changed by adjusting the number of flip-flops FFs.

Although an embodiment of the present disclosure discloses that the data generator 140 includes four flip-flops FFs, embodiments are not limited thereto. In another embodiment, the data generator 140 includes more than four or less than four flip-flops FFs changes.

With the development of CMOS integrated circuit (IC) technology, the degree of integration of a semiconductor device is rapidly increasing, and an operation speed of the semiconductor device is also rapidly increasing. Accordingly, a wafer-level test device in accordance with an embodiment tests a plurality of semiconductor devices at a high frequency.

Since the existing wafer-level test devices do not support a high frequency or a high operation speed of a semiconductor device, a technology for performing a wafer-level test operation at a higher frequency is in demand to test a semiconductor device (e.g., a semiconductor memory device) operating at high speed. For this purpose, a semiconductor test device according to an embodiment uses an internal clock signal to test a semiconductor device at a high frequency.

Figure 5:
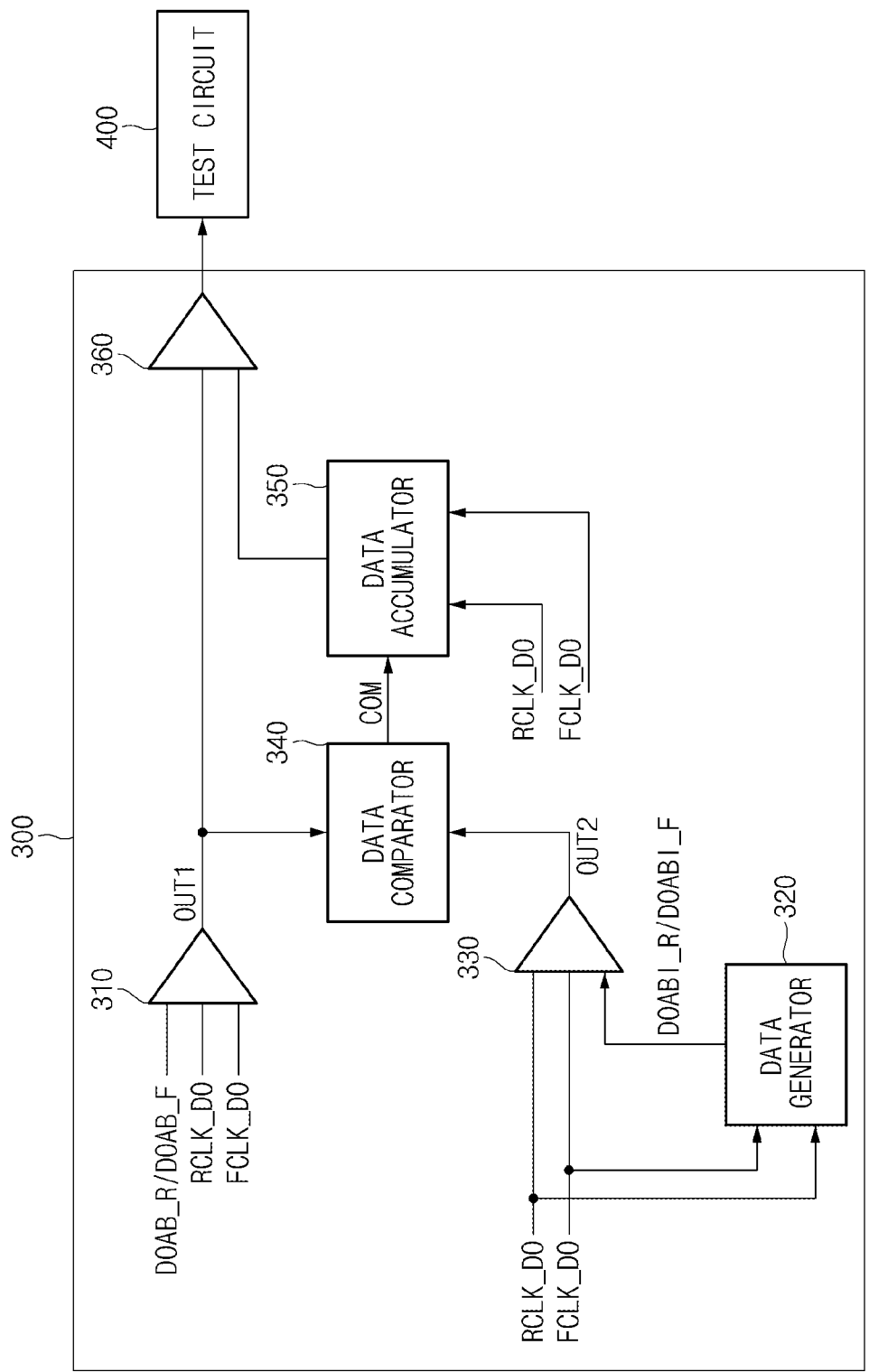
FIG. 5 is a block diagram illustrating a semiconductor test device according to another embodiment.

FIG. 5 is a block diagram illustrating a semiconductor test device according to another embodiment. The semiconductor test device shown in FIG. 5 is implemented in a data output path, and thus may perform a high-speed test operation together with the semiconductor test device shown in FIG. 1.

Referring to FIG. 5, the semiconductor test device includes an output test circuit 300 and a test circuit 400. The output test circuit 300 includes a pre-driver 310, a data generator 320, an internal pre-driver 330, a data comparator 340, a data accumulator 350, and an output driver 360.

The pre-driver 310 drives output data DOAB_R and DOAB_F in response to a rising clock RCLK_DO and a falling clock FCLK_DO, respectively, and outputs an output signal OUT1 to the data comparator 340 and the output driver 360. That is, the output data DOAB_R is driven in response to the rising clock RCLK_DO, and the output data DOAB_F is driven in response to the falling clock FCLK_DO. In an embodiment, the output data DOAB_R and DOAB_F are output from a page buffer of an internal logic circuit such as the internal logic circuit 200 of FIG. 1.

The data generator 320 generates output data DOABI_R and DOABI_F in response to the rising clock RCLK_DO and the falling clock FCLK_DO, respectively, and outputs the output data DOABI_R and DOABI_F to the internal pre-driver 330. The output data DOABI_R and DOABI_F are expected data that are generated in the data generator 320. In an embodiment, the output data DOABI_R and DOABI_F correspond to the internal data INT_DATA generated in the data generator 140 shown in FIG. 1.

The internal pre-driver 330 drives the output data DOABI_R and DOABI_F in response to the rising clock RCLK_DO and the falling clock FCLK_DO, respectively, and outputs an output signal OUT2 to the data comparator 340. That is, the output data DOABI_R is driven in response to the rising clock RCLK_DO, and the output data DOABI_F is driven in response to the falling clock FCLK_DO.

The data comparator 340 compares the output signal OUT1 of the pre-driver 310 with the output signal OUT2 of the internal pre-driver 330, and outputs a comparison signal COM to the data accumulator 350.

The data accumulator 350 accumulates the comparison signal COM in response to the rising clock RCLK_DO and the falling clock FCLK_DO, and outputs the accumulated result to the output driver 360. In an embodiment, the data accumulator 350 includes a latch circuit. If the data accumulator 350 receives an unmatched signal from the data comparator 340, the data accumulator 350 resets the latch circuit and outputs failure information to the output driver 360.

During a normal mode, the output driver 360 drives the output signal OUT1 of the pre-driver 310, and outputs the driven result to the test circuit 400. During a test mode, the output driver 360 drives an output signal of the data accumulator 350, and outputs the driven result to the test circuit 400. The test circuit 400 checks output data of the output driver 360 during the test mode, such that the test circuit 400 can detect errors occurring in output data in a high-speed test operation at a wafer level.

As described above, the semiconductor test device according to another embodiment excludes the output data DOAB_R and DOAB_F during the test mode, internally generates the output data DOABI_R and DOABI_F, and then outputs the output data DOABI_R and DOABI_F to the test circuit 400. In other words, the semiconductor test device internally sets output data using the data generator 320 so as to test output data at a desired speed during the test mode.

Accordingly, the semiconductor test device according to another embodiment can reduce a turn around time (TAT) by efficiently testing output data at high speed at a wafer level prior to packaging.

Figure 6:
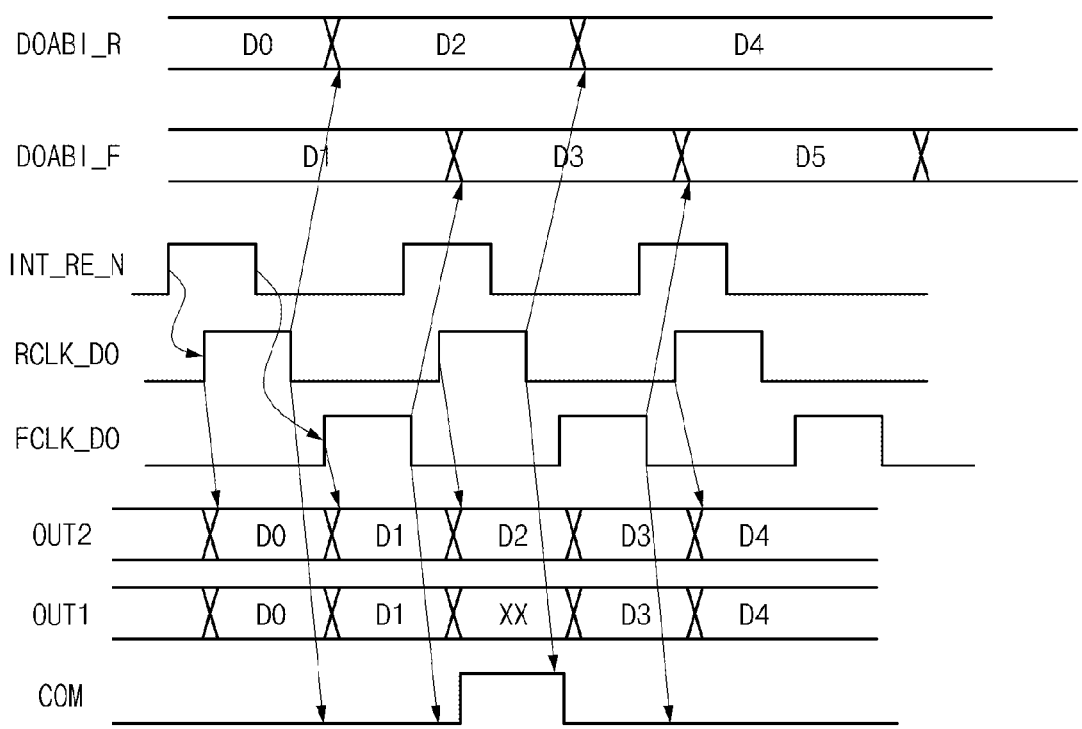
FIG. 6 is a timing diagram illustrating operations of the semiconductor test device shown in FIG. 5 according to an embodiment.

FIG. 6 is a timing diagram illustrating operations of the semiconductor test device shown in FIG. 5 according to an embodiment. Operations of the semiconductor test device will be described with reference to FIG. 5.

In an embodiment, an internal logic circuit outputs data from a page buffer in response to an internal reference clock INT_RE_N. The internal reference clock INT_RE_N may be a clock signal generated by an oscillator included in the internal logic circuit. The rising clock RCLK_DO is a clock enabled by latching a rising edge of the internal reference clock INT_RE_N for a predetermined time. The falling clock FCLK_DO is a clock enabled by latching a falling edge of the internal reference clock INT_RE_N for a predetermined time. In an embodiment, the internal reference clock INT_RE_N corresponds to the internal clock signal RDQSI_2 described with reference to FIG. 1.

The pre-driver 310 drives the output data DOAB_R and DOAB_F in response to the rising clock RCLK_DO and the falling clock FCLK_DO, respectively, and outputs the output signal OUT1 to the data comparator 340 and the output driver 360.

During a test mode, the data generator 320 generates and latches arbitrary output data DOABI_R and DOABI_F in response to the rising clock RCLK_DO and the falling clock FCLK_DO, respectively, so as to perform a high-speed test operation, and outputs the output data DOABI_R and DOABI_F to the internal pre-driver 330. The data generator 320 generates the output data DOABI_R in response to a falling edge of the rising clock RCLK_DO, and generates the output data DOABI_F in response to a falling edge of the falling clock FCLK_DO.

The internal pre-driver 330 drives the internally-generated output data DOABI_R and DOABI_F, and outputs the output signal OUT2 to the data comparator 340.

The pre-driver 310 and the internal pre-driver 330 both operate in response to the rising clock RCLK_DO and the falling clock FCLK_DO. Accordingly, the output signal OUT1 obtained by driving the output data DOAB_R and DOAB_F generated from the page buffer of the internal logic circuit is output at substantially the same time as the output signal OUT2 obtained by driving the output data DOABI_R and DOABI_F generated from the data generator 320.

After that, the data comparator 340 determines whether the output signal OUT1 and the output signal OUT2 are output at the same time. That is, the data comparator 340 determines whether data output from the pre-driver 310 in response to the rising clock RCLK_DO is identical to data output from the internal pre-driver 330 in response to the rising clock RCLK_DO and whether data output from the pre-driver 310 in response to the falling FCLK_DO is identical to data output from the internal pre-driver 330 in response to the falling clock FCLK_DO.

For example, if both of the output signals OUT1 and OUT2 at a rising edge of the rising clock RCLK_DO are denoted by data D0, the data comparator 340 determines that data output from the pre-driver 310 and data output from the internal pre-driver 330 are identical to each other. If both of the output signals OUT1 and OUT2 at a rising edge of the falling clock FCLK_DO are denoted by data D1, the data comparator 340 determines that data output from the pre-driver 310 and data output from the internal pre-driver 330 are identical to each other. In this case, the data comparator 340 outputs a comparison signal COM of a low level.

On the other hand, if the output signal OUT1 at the rising edge of the rising clock RCLK_DO is denoted by data D2 whereas the output signal OUT2 is denoted by data XX, the data comparator 340 determines that data output from the pre-driver 310 and data output from the internal pre-driver 330 are not identical to each other. In this case, the data comparator 340 outputs the comparison signal COM of a high level, i.e., outputs a data failure signal. After the comparison signal COM of the high level is output, the data comparator 340 changes the comparison signal COM to a low level when the rising clock RCLK_DO is disabled to a low level. A value of the comparison signal COM generated from the data comparator 340 is stored in the data accumulator 350.

Figure 7:
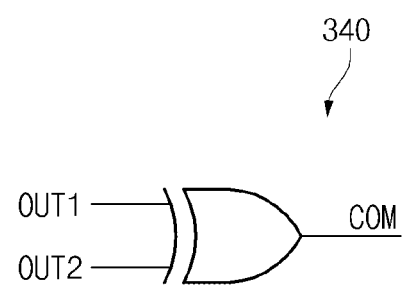
FIG. 7 is a detailed circuit diagram illustrating a data comparator shown in FIG. 5 according to an embodiment.

FIG. 7 is a detailed circuit diagram illustrating the data comparator 340 shown in FIG. 5 according to an embodiment. The data comparator 340 includes an exclusive-OR (XOR) gate for performing an XOR operation on the output signal OUT1 and the output signal OUT2.

Figure 8:
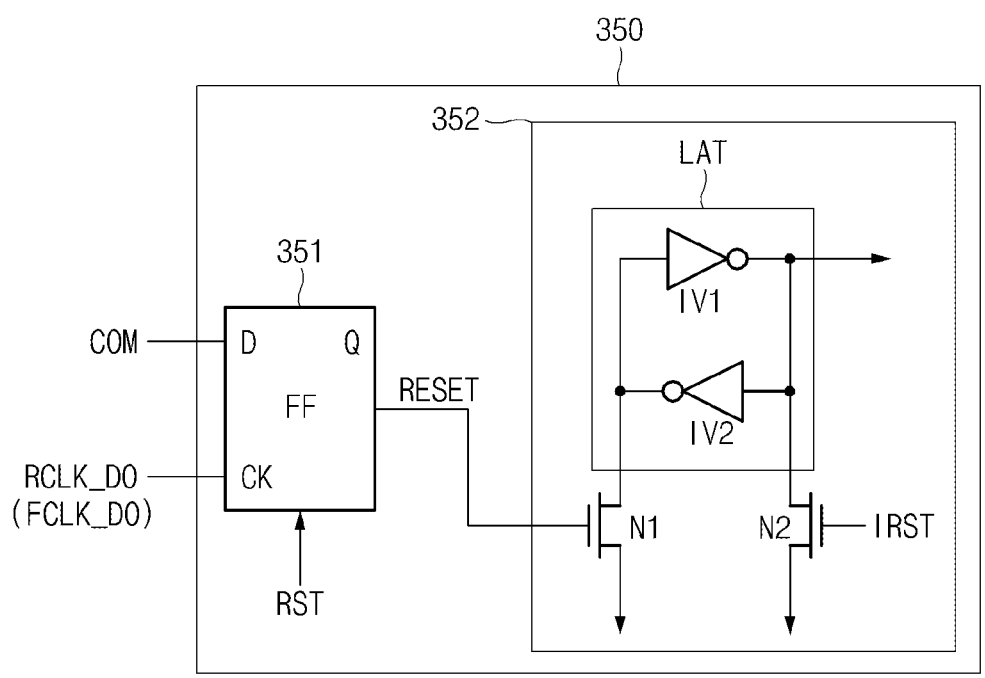
FIG. 8 is a detailed circuit diagram illustrating a data accumulator shown in FIG. 5 according to an embodiment.

FIG. 8 is a detailed circuit diagram illustrating the data accumulator 350 shown in FIG. 5 according to an embodiment. The data accumulator 350 includes a flip-flop 351 and a latch circuit 352. The flip-flop 351 receives the comparison signal COM as input data D, and outputs a reset signal RESET to an output terminal Q. The flip-flop 351 operates in synchronization with a falling edge of the rising clock RCLK_DO and a falling edge of the falling clock FCLK_DO. The flip-flop 351 may be initialized by a reset signal RST.

That is, if the output signals OUT1 and OUT2 are matched to each other, the comparison signal COM of the data comparator 340 goes to a low level. As a result, the reset signal RESET is maintained at a low level. On the other hand, if the output signals OUT1 and OUT2 are not matched to each other, the comparison signal COM of the data comparator 340 is transitioned to a high level. As a result, the reset signal RESET is transitioned to a high level.

The latch circuit 352 includes a latch element LAT and NMOS transistors N1 and N2. The latch element LAT includes inverters IV1 and IV2 interconnected in the form of a latch, so that the latch element LAT can latch the reset signal RESET.

The NMOS transistor N2 is turned on in response to an initial reset signal IRST. That is, the NMOS transistor N2 is turned on when the initial reset signal IRST is enabled to a high level, so that a signal stored in the latch element LAT is initialized to a low level. The NMOS transistor N1 receives the reset signal RESET through a gate terminal. If the reset signal RESET is at a high level, the NMOS transistor N1 is turned on so that the signal stored in the latch element LAT is reset, and thus a high-level signal is output to the output driver 360.

For example, if the output signals OUT1 and OUT2 are matched and the comparison signal COM is output at a low level, the NMOS transistor N1 is not turned on. As a result, the latch circuit 352 outputs the initialized low-level signal to the output driver 360. If the output driver 360 outputs low-level data based on the low-level signal from the latch circuit 352 of the data accumulator 350, the test circuit 400 determines that data is passed, i.e., detects a data pass status.

On the other hand, if the output signals OUT1 and OUT2 are mismatched and the comparison signal COM is output as a high level, the NMOS transistor N1 is turned on. As a result, the latch circuit 352 outputs a high-level signal to the output driver 360. If the output driver 360 outputs a high-level signal based on the high-level signal from the latch circuit 352 of the data accumulator 350, the test circuit 400 determines that there is a data error, i.e., detects a data failure status.

As described above, a semiconductor test device according to an embodiment internally generates an internal clock and internal data used in a high-speed test operation without receiving an external clock and external data. As a result, the semiconductor test device can efficiently test input/output (I/O) data at a high speed.

As is apparent from the above description, a semiconductor test device according to an embodiment excludes external data and an external clock, and internally generates data and a clock signal. As a result, the semiconductor test device can efficiently test a dual data rate (DDR) at high speed using the internally generated data and clock signal, resulting in reduction of a turn around time TAT of the semiconductor test device.

Those skilled in the art will appreciate that embodiments of the present disclosure may be carried out in other specific ways than those set forth herein without departing from the spirit and essential characteristics of the present disclosure. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor test device comprising:
   a clock generator suitable for generating an internal clock signal in response to a test mode signal during a test mode;
   a data generator suitable for generating internal data in response to the internal clock signal; and
   a data latch circuit suitable for latching the internal data in response to the internal clock signal, and outputting a rising clock synchronized with a rising edge of the internal clock signal, a falling clock synchronized with a falling edge of the internal clock signal, and the latched data to an internal logic circuit,
   wherein the data latch circuit latches the internal data in response to a rising edge of the rising clock and a rising edge of the falling clock.

2. The semiconductor test device according to claim 1, wherein the data generator generates the internal data in response to the rising clock and the falling clock.

3. The semiconductor test device according to claim 2, wherein the data generator generates the internal data in synchronization with the rising edge of the rising clock and the rising edge of the falling clock.

4. The semiconductor test device according to claim 2, wherein the data generator includes a plurality of flip-flops driven by the rising clock and the falling clock.

5. The semiconductor test device according to claim 4, wherein each of the flip-flops operates in synchronization with the rising edge of the rising clock and the rising edge of the falling clock.

6. The semiconductor test device according to claim 4, wherein each of the plurality of flip-flops receives a set signal and a reset signal as input signals, and the flip-flops operate independently from each other.

7. The semiconductor test device according to claim 1, wherein the data latch circuit latches first internal data in response to the rising edge of the rising clock and outputs first input data, and latches second internal data in response to the rising edge of the falling clock and outputs second input data.

8. The semiconductor test device according to claim 7, wherein each of the first input data and the second input data is double data rate (DDR) data.

9. The semiconductor test device according to claim 1, wherein the test mode is performed at a wafer level.

* * * * *